US008710930B2

(12) United States Patent
Tan et al.

(10) Patent No.: US 8,710,930 B2
(45) Date of Patent: Apr. 29, 2014

(54) DIFFERENTIAL RING OSCILLATOR AND METHOD FOR CALIBRATING THE DIFFERENTIAL RING OSCILLATOR

(75) Inventors: Chun Geik Tan, Singapore (SG); Renliang Zheng, Singapore (SG); Tieng Ying Choke, Singapore (SG)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 13/615,543

(22) Filed: Sep. 13, 2012

(65) Prior Publication Data

US 2013/0181781 A1   Jul. 18, 2013

Related U.S. Application Data

(60) Provisional application No. 61/585,813, filed on Jan. 12, 2012.

(51) Int. Cl.
*H03K 3/03* (2006.01)
(52) U.S. Cl.
USPC ........................................... 331/57; 331/185
(58) Field of Classification Search
USPC .................................................. 331/57, 185
See application file for complete search history.

(56) References Cited

U.S. PATENT DOCUMENTS

| 6,396,358 | B1 | 5/2002 | Poss | |
|---|---|---|---|---|
| 6,690,241 | B2 | 2/2004 | Ooishi | |
| 7,336,134 | B1 | 2/2008 | Janesch | |
| 7,348,860 | B2 | 3/2008 | Rhee | |
| 2002/0175772 | A1* | 11/2002 | Cyrusian et al. | 331/57 |
| 2009/0322425 | A1* | 12/2009 | Shako et al. | 330/149 |

OTHER PUBLICATIONS

Kadaba R. Lakshmikumar, IEEE Transactions on Circuits and Systems, Analog PLL Design With Ring Oscillators at Low-Gigahertz Frequencies in Nanometer CMOS: Challenges and Solutions, May 2009, 389-393, vol. 56, No. 5.
Bassem Fahs, Walid Y. Ali-Ahmad, and Patrice Gamand, IEEE Transactions on Microwave Theory and Techniques, A Two-Stage Ring Oscillator in 0.13-um CMOS for UWB Impulse Radio, May 2009, 1074-1082, vol. 57, No. 5.

* cited by examiner

*Primary Examiner* — Joseph Chang
(74) *Attorney, Agent, or Firm* — Winston Hsu; Scott Margo (57) ABSTRACT

A differential ring oscillator includes a plurality of delay stages connected in a ring. At least one of the delay stages includes: a current source, arranged to generate a bias current according to a coarse tuning signal; a latching circuit arranged to generate a differential output signal to a next delay stage according to a differential input signal from a previous delay stage; a capacitive array arranged to provide a first capacitance according to a fine tuning signal; and a varactor device arranged to provide a second capacitance according to a controllable signal for locking an oscillating frequency of the differential ring oscillator to a target frequency. The coarse tuning signal and fine tuning signal are arranged for adjusting the oscillating frequency of the differential ring oscillator to, respectively, reach a predetermined frequency range including the target frequency and to approach the target frequency in the predetermined frequency range.

17 Claims, 6 Drawing Sheets

DIFFERENTIAL RING OSCILLATOR AND METHOD FOR CALIBRATING THE DIFFERENTIAL RING OSCILLATOR

CROSS REFERENCE TO RELATED APPLICATIONS

This application claims the benefit of U.S. Provisional Application No. 61/585,813, which was filed on 2012 Jan. 12 and is included herein by reference.

BACKGROUND

The present invention is related to a differential ring oscillator and a calibration method thereof, and more particularly to a differential ring oscillator and a related method capable of calibrating the differential ring oscillator to compensate for semiconductor process variations.

In a phase-locked loop, an oscillator is used to generate an oscillating signal according to a tuning signal when the phase-locked loop is operated under a frequency-locked mode. Ring oscillators are often utilized in the phase-locked loop due to their simple structure and easy implementation. Moreover, the ring oscillator occupies a small area and has no magnetic coupling problem when combined with other systems since no inductor is used therein. Another advantage of the ring oscillator is that the even number ring oscillator stages generate quadrature output phases, saving the need for a divide by 2. The frequency of the oscillating signal generated by the ring oscillator may vary greatly, however, due to semiconductor process variations i.e. the corners of the semiconductor manufacturing process. Therefore, there is a need for developing a calibrating scheme capable of calibrating the ring oscillator affected by process variations in order to generate an oscillating signal having a predetermined target frequency.

SUMMARY

One of the objectives of the present embodiment is to provide a device and a related method capable of calibrating a differential ring oscillator caused by a semiconductor process variation.

According to a first embodiment, a differential ring oscillator is disclosed. The differential ring oscillator comprises a plurality of delay stages connected in a ring, wherein at least one of the delay stages comprises a current source, a latching circuit, a capacitive array, and a varactor device. The current source is arranged to generate a bias current according to a coarse tuning signal. The latching circuit is coupled to the current source and arranged to generate a differential output signal to a next delay stage according to a differential input signal from a previous delay stage. The capacitive array is coupled to the latching circuit and arranged to provide a first capacitance according to a fine tuning signal. The varactor device is coupled to the capacitive array and arranged to provide a second capacitance according to a controllable signal such that an oscillating frequency of the differential ring oscillator is locked to a target frequency, wherein the coarse tuning signal is arranged for adjusting the oscillating frequency of the differential ring oscillator to reach a predetermined frequency range including the target frequency, and the fine tuning signal is arranged for adjusting the oscillating frequency of the differential ring oscillator to approach the target frequency in the predetermined frequency range.

According to a second embodiment, a method for calibrating a differential ring oscillator is disclosed. The differential ring oscillator comprises a plurality of delay stages, at least one of the delay stages comprising a current source, a latching circuit, a capacitive array, and a varactor device, and the method comprises: generating a bias current according to a coarse tuning signal; generating a differential output signal to a next delay stage according to a differential input signal from a previous delay stage; providing a first capacitance according to a fine tuning signal; and providing a second capacitance according to a controllable signal such that an oscillating frequency of the differential ring oscillator is locked to a target frequency, wherein the coarse tuning signal is arranged for adjusting the oscillating frequency of the differential ring oscillator to reach a predetermined frequency range including the target frequency, and the fine tuning signal is arranged for adjusting the oscillating frequency of the differential ring oscillator to approach the target frequency in the predetermined frequency range.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
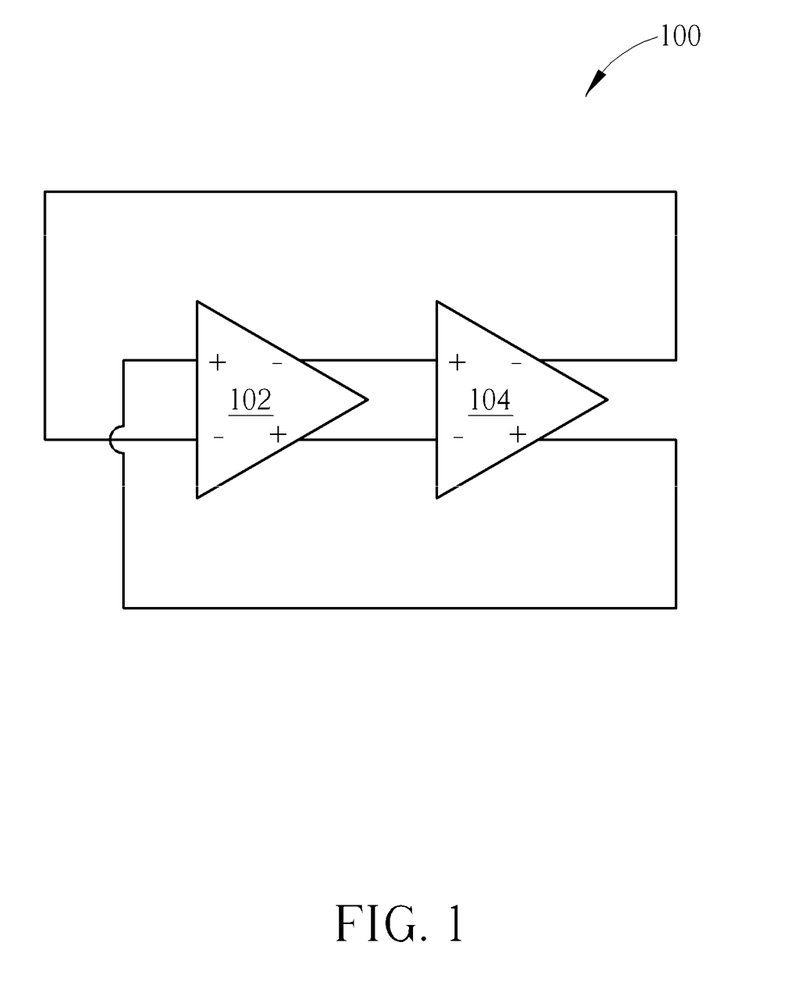
FIG. 1 is a diagram illustrating a differential ring oscillator according to an embodiment of the present invention.
Figure 2:
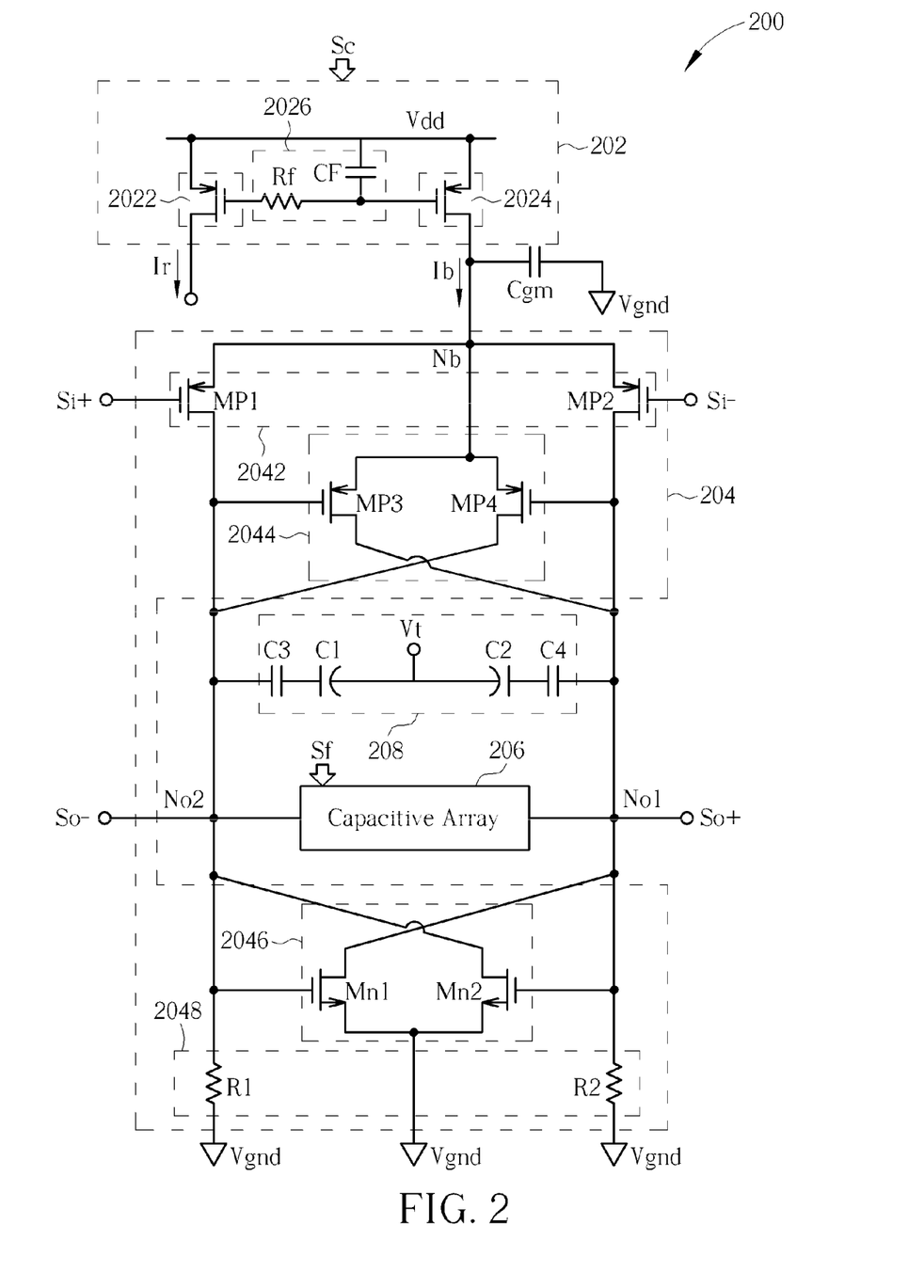
FIG. 2 is a diagram illustrating a delay stage of a differential ring oscillator according to an embodiment of the present invention.

Please refer to FIG. 1, which is a diagram illustrating a differential ring oscillator 100 according to an embodiment of the present invention. The differential ring oscillator 100 comprises a plurality of delay stages 102, 104, in which the plurality of delay stages 102, 104 are connected in a ring. It is noted that using two delay stages is merely one example, and using other number of ring-connected stages (e.g. three or four delay stages) also belongs to the scope of the present invention. Furthermore, at least one of the plurality of delay stages 102, 104 comprises the delay stage of FIG. 2. It is noted that the best mode of the present differential ring oscillator 100 is to apply the delay stage configuration of FIG. 2 into the delay stages 102 and 104. FIG. 2 is a diagram illustrating a delay stage 200 of the differential ring oscillator 100 according to an embodiment of the present invention. The delay stage 200 comprises a current source 202, a latching circuit 204, a capacitive array 206, and a varactor device 208. The current source 202 is arranged to generate a bias current Ib according to a coarse tuning signal Sc. The latching circuit 204 is coupled to the current source 202 and is arranged to generate a differential output signal So+, So− to a next delay stage (e.g. the delay 204) according to a differential input signal Si+, Si− from a previous delay stage (e.g. the delay 204). The capacitive array 206 is coupled to the latching circuit 204 and is arranged to provide a first capacitance according to a fine tuning signal Sf. The varactor device 208 is coupled to the capacitive array 206 and is arranged to provide a second capacitance according to a controllable tuning signal Vt such that an oscillating frequency Fo of the differential ring oscillator 100 is locked to a target frequency Ft. Furthermore, the coarse tuning signal Sc is arranged for adjusting the oscillating frequency Fo of the differential ring oscillator 100 to reach a predetermined frequency range FR including the target frequency Ft, and the fine tuning signal Sf is arranged for adjusting the oscillating frequency Fo of the differential ring oscillator 100 to approach the target frequency Ft in the predetermined frequency range FR.

The current source 202 comprises a diode-connected transistor 2022, a plurality of transistors 2024, and a filtering circuit 2026. The diode-connected transistor 2022 is a P-type field-effect transistor, and the diode-connected transistor 2022 is coupled to a reference voltage (i.e. a supply voltage) Vdd and a reference current Ir. Each of the plurality of transistors 2024 is a P-type field-effect transistor. However, for brevity, the plurality of transistors 2024 is illustrated by only one P-type field-effect transistor in FIG. 2. Furthermore, each P-type field-effect transistor has a gate terminal, a source terminal, and a drain terminal. In this embodiment, the filtering circuit 2026 comprising a capacitor Cf and a resistor Rf is coupled between the diode-connected transistor 2022 and the plurality of transistors 2024. The plurality of gate terminals of the plurality of transistors 2024 are coupled to the gate terminal of the diode-connected transistor 2022, the plurality of source terminals of the plurality of transistors 2024 are coupled to the reference voltage Vdd, the plurality of drain terminals of the plurality of transistors 2024 are coupled to a terminal Nb of the latching circuit 202, and the plurality of transistors 2024 are arranged to mirror the reference current Ir for generating the bias current Ib according to the coarse tuning signal Sc. In other words, the plurality of transistors 2024 are composed of a plurality of binary programmed transistors. Moreover, another capacitor Cgm is coupled between the terminal Nb and the ground voltage Vgnd.

In addition, the latching circuit 204 comprises a differential input stage 2042, a first latching cell 2044, a second latching cell 2046, and a resistive device 2048. The differential input stage 2042 is coupled to the terminal Nb of the current source 202 and has a first input terminal and a second input terminal arranged to receive a first input signal (i.e. Si+) and a second input signal (i.e. Si−) of the differential input signal Si+, Si− to generate a first output signal (i.e. So+) and a second output signal (i.e. So−) of the differential output signal So+, So− at a first output terminal No1 and a second output terminal No2 respectively. The first latching cell 2044 is coupled to the terminal Nb of the current source 202, the first output terminal No1, and the second output terminal No2. The first latching cell 2044 is arranged to latch the first output signal So+ and the second output signal So−. The second latching cell 2046 is coupled to the first output terminal No1, the second output terminal No2, and the ground voltage Vgnd. The second latching cell 2046 is arranged to latch the first output signal So+ and the second output signal So−. The resistive device 2048 comprises a first resistor R1 and a second resistor R2. The first resistor R1 is coupled between the second output terminal No2 and the ground voltage Vgnd, and the second resistor R2 is coupled between the first output terminal No1 and the ground voltage Vgnd.

The differential input stage 2042 is a P-type transistor pair comprising two P-type transistors Mp1, Mp2. The first latching cell 2044 is a P-type transistor latching cell comprising two P-type transistors Mp3, Mp4. The second latching cell 2046 is an N-type transistor latching cell comprising two N-type transistors Mn1, Mn2. In addition, the capacitor Cgm is used to increase the transconductance (i.e. gm) of the P-type transistors Mp1, Mp2. The connections between the P-type transistors Mp1, Mp2, Mp3, Mp4, and N-type transistors Mn1, Mn2 are illustrated in FIG. 2; the detailed description is omitted here for brevity.

The varactor device 208 comprises a plurality of capacitors C1, C2, C3, C4, wherein the capacitors C1 and C2 are adjustable capacitors, and the capacitances of the capacitors C1 and C2 are controlled by the voltage level of the controllable tuning signal Vt. More specifically, the plurality of capacitors C1, C2, C3, C4 are connected in series, and coupled to the first output terminal No1 and the second output terminal No2. The controllable tuning signal Vt is inputted to a terminal Nt between the capacitors C1 and C2, and arranged to control the capacitors C1 and C2 for providing the second capacitance.

It should be noted that the capacitive array 206 may comprise a plurality of capacitors and a plurality of switches (not shown), in which the connectivity of the plurality of switches are controlled by the fine tuning signal Sf. Consequently, the first capacitance can be set by the fine tuning signal Sf. The detailed structure of the capacitive array 206 is omitted here for brevity.

The reference voltage Vdd supplied to the current source 202 is generated by a low-dropout regulator. The differential input stage 2042 of the delay stage 200 and the first latching cell 2044 are P-type input stage (e.g. P-type Metal Oxide Semiconductor input stage), and the current source 202 is also a P-type current source (i.e. the bias current Ib is provided by the P-type transistors 2024), so the noise of the low-dropout regulator can be rejected. In other words, the Power Supply Rejection Ratio (PSRR) of the delay stage 200 is improved.

Since the P-type first latching cell 2044 and the N-type second latching cell 2046 are arranged to latch the first output signal So+ and the second output signal So− of the delay stage 200, the P-type first latching cell 2044 and the N-type second latching cell 2046 can be used to define the oscillation condition of the differential ring oscillator 100. In addition, the first resistor R1 and the second resistor R2 are regarded as the resistive load of the delay stage 200.

Figure 3:
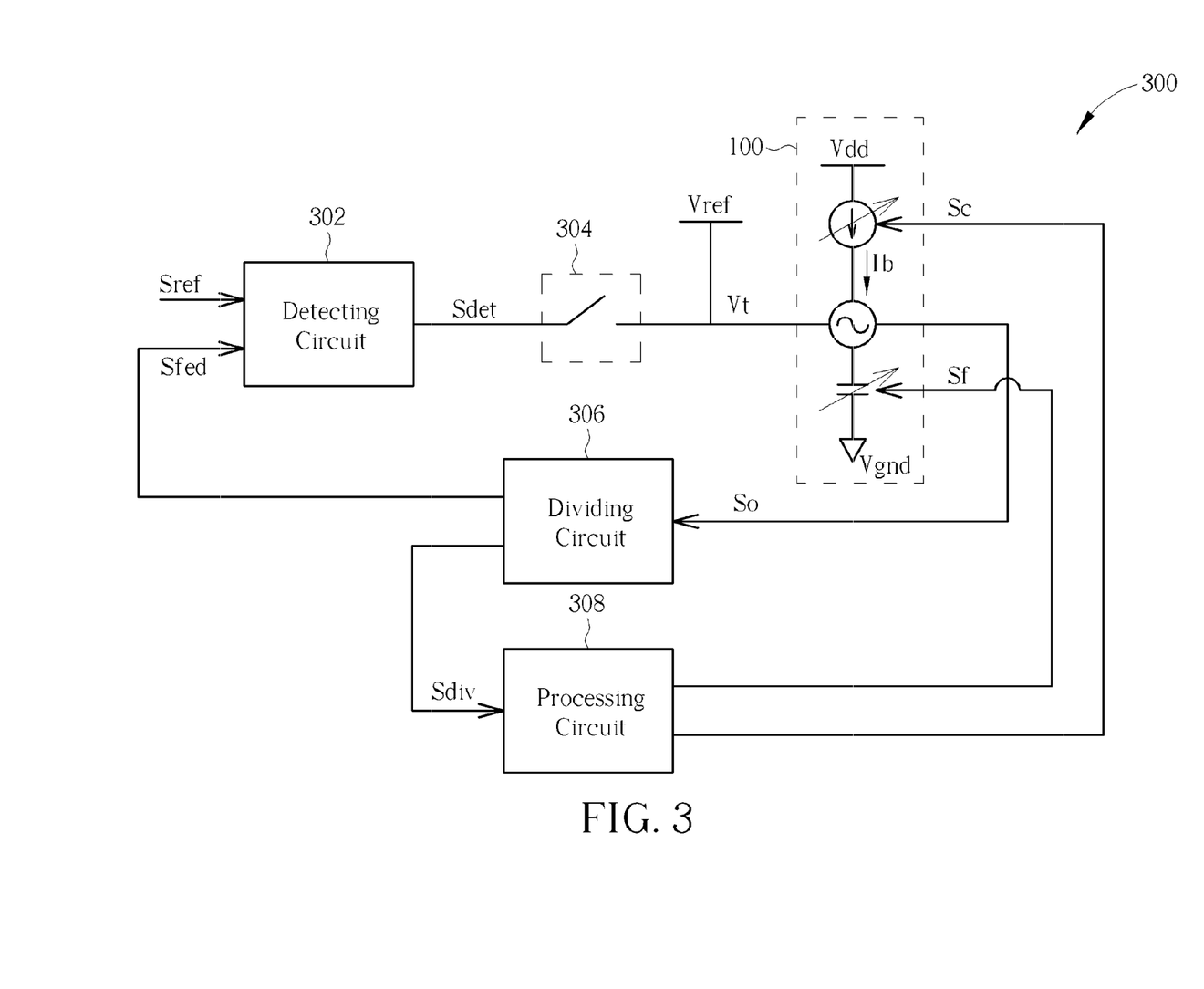
FIG. 3 is a diagram illustrating a frequency calibrating arrangement for calibrating a differential ring oscillator according to an embodiment of the present invention.

Please refer to FIG. 3, which is a diagram illustrating a frequency calibrating arrangement 300 for calibrating the differential ring oscillator 100 according to an embodiment of the present invention. The frequency calibrating arrangement 300 is arranged to calibrate the differential ring oscillator 100 after it is fabricated by a semiconductor process, and the differential ring oscillator 100 undergoes a process variation. The frequency calibrating setup 300 comprises a detecting circuit 302, a switching circuit 304, the differential ring oscillator 100, a dividing circuit 306, and a processing circuit 308. It is noted that the detecting circuit 302 may comprise a phase/frequency detector, a charge pump circuit, and/or a low pass filter, and the detecting circuit 302 is utilized to detect a reference clock signal Sref and a feedback clock signal Sfed to generate a detecting signal Sdet. The detecting signal Sdet is used to generate a tuning signal for the differential ring oscillator 100 when the phase-locked loop, which comprises the detecting circuit 302, the differential ring oscillator 100, and the dividing circuit 306, is arranged to lock the reference clock signal Sref to generate an output clock signal. Therefore, in the frequency calibrating mode, the detecting circuit 302 is disable, and/or the switching circuit 304 is open (i.e. turned off) in order to block the detecting signal Sdet from reaching the differential ring oscillator 100. When the frequency calibrating arrangement 300 operates under the frequency calibrating mode for calibrating the differential ring oscillator 100, the differential ring oscillator 100, the dividing circuit 306 and the processing circuit 308 are enabled.

In the frequency calibrating mode, the dividing circuit 306 is utilized to divide the differential output signal So+, So− (which is labeled as So in FIG. 3) to generate a divided output signal Sdiv. The processing circuit 308 is utilized to generate the coarse tuning signal Sc for the differential ring oscillator 100 when the frequency calibrating arrangement 300 operates under a coarse tuning mode, and generate the fine tuning signal Sf for the differential ring oscillator 100 when the frequency calibrating arrangement 300 operates under a fine tuning mode. The fine tuning signal Sf may be set as a predetermined signal during the coarse tuning mode, and the coarse tuning signal Sc is fixed to the determined coarse tuning signal during the fine tuning mode. Moreover, the controllable tuning signals Vt of each delay stage 200 in the differential ring oscillator 100 are coupled to a predetermined reference voltage Vref, such as the supply voltage Vdd, during the coarse tuning mode and the fine tuning mode.

Figure 4:
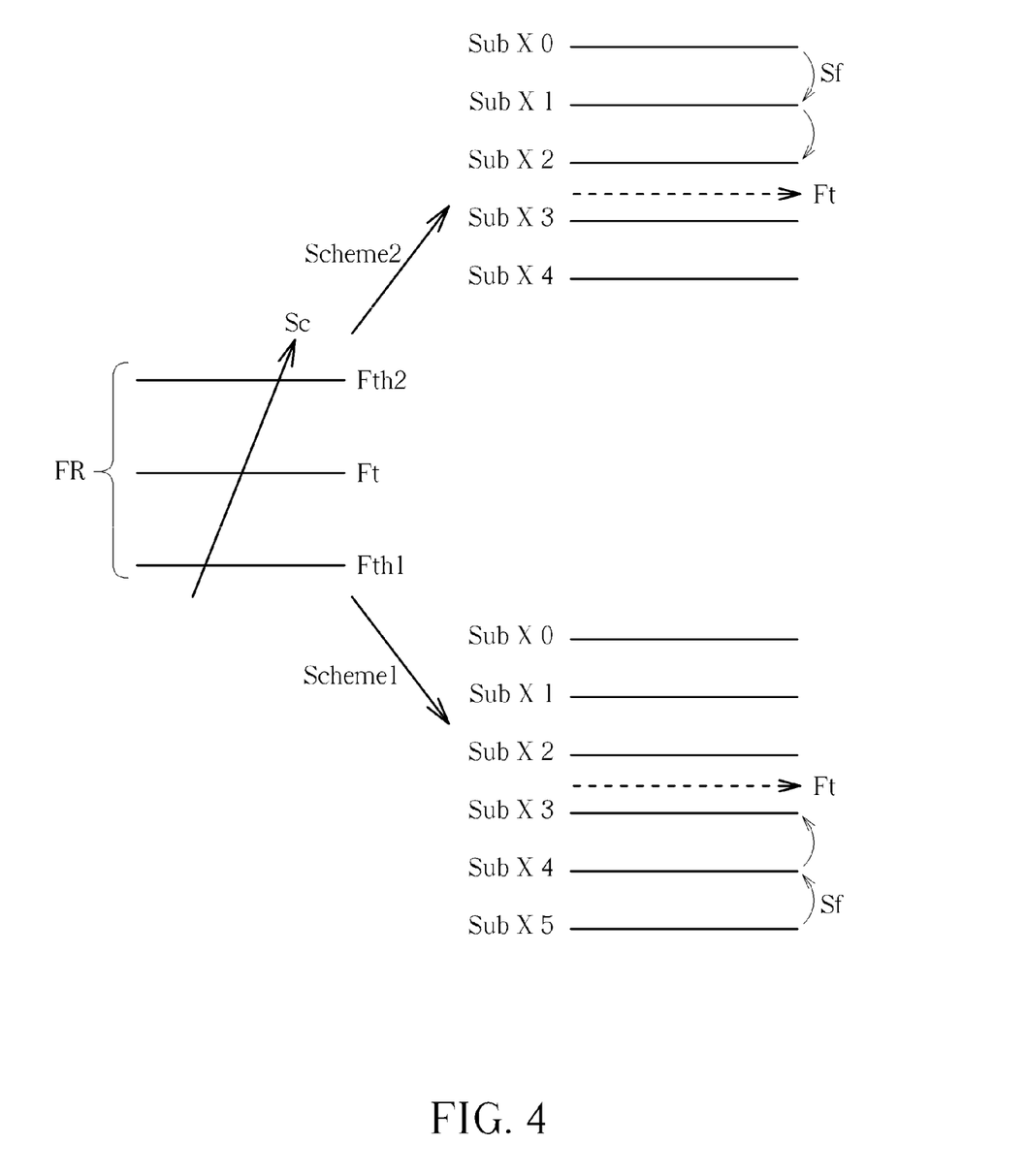
FIG. 4 is a diagram illustrating the variation in frequency of an output signal due to a coarse tuning signal and a fine tuning signal during a coarse tuning mode and a fine tuning mode according to an embodiment of the present invention.

Please refer to FIG. 4, which is a diagram illustrating the variation of the frequency of the output signal So due to the coarse tuning signal Sc and the fine tuning signal Sf during the coarse tuning mode and the fine tuning mode according to an embodiment of the present invention. In FIG. 2, two optional schemes 1 & 2 are used to approach the target frequency Ft. Scheme 1 is for increasing the bias current Ib of each delay stage 200 in the differential ring oscillator 100 by the coarse tuning signal Sc to make the oscillating frequency of the output signal So reach or just cross the lower bound Fth1 of the predetermined frequency range FR, and then reduce the first capacitance of the capacitive array 206 of each delay stage 200 in the differential ring oscillator 100 by the fine tuning signal Sf to make the oscillating frequency of the output signal So reach or approach the target frequency Ft as shown in FIG. 4. Scheme 2 is for increasing the bias current Ib of each delay stage 200 in the differential ring oscillator 100 by the coarse tuning signal Sc to make the oscillating frequency of the output signal So reach or just cross the higher bound Fth2 of the predetermined frequency range FR, and then increase the first capacitance of the capacitive array 206 of each delay stage 200 in the differential ring oscillator 100 by the fine tuning signal Sf to make the oscillating frequency of the output signal So reach or approach the target frequency Ft as shown in FIG. 4.

Figure 5:
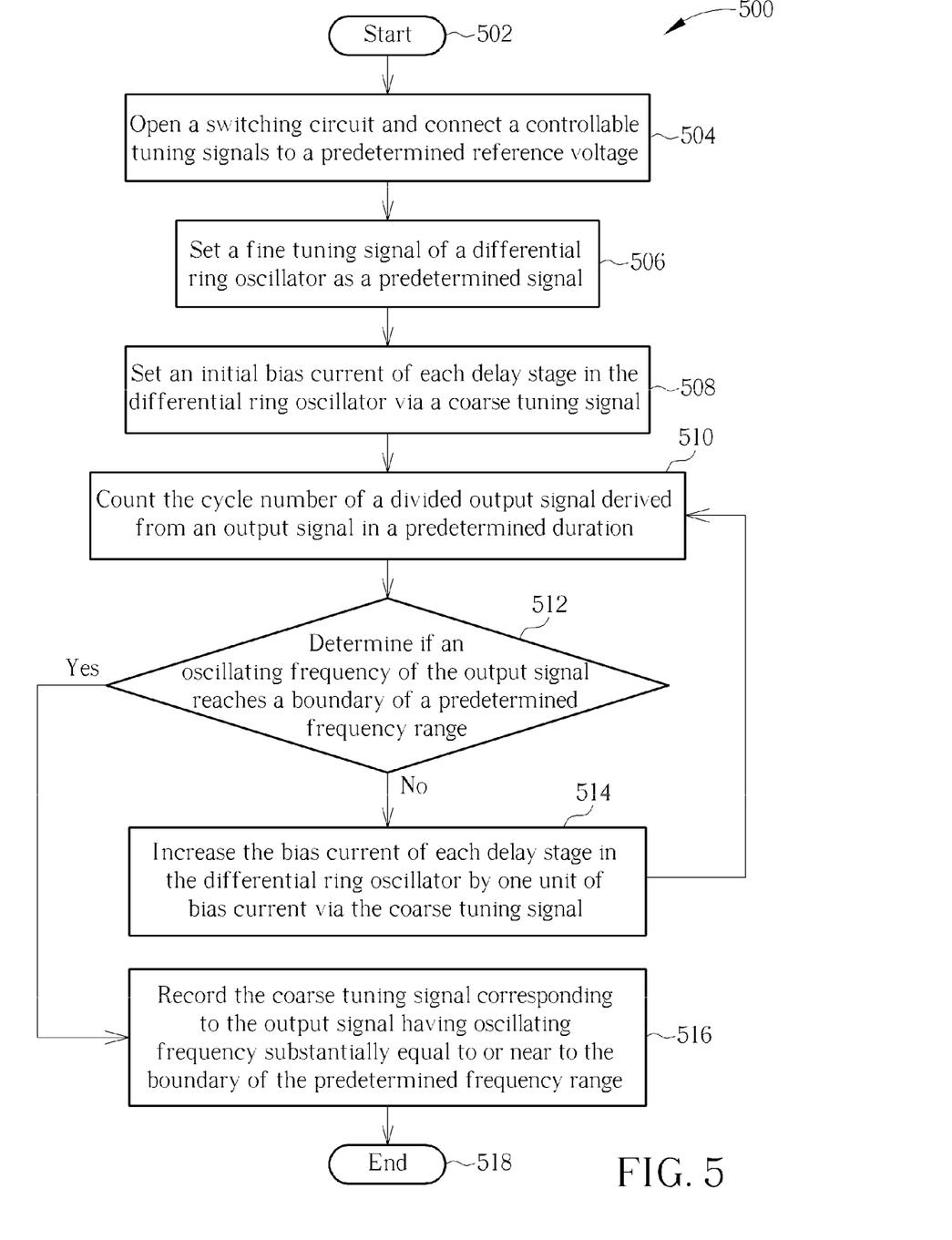
FIG. 5 is a flowchart illustrating a method of coarse tuning an oscillating frequency of a differential ring oscillator according to an embodiment of the present invention.

The coarse tuning mode of calibrating the differential ring oscillator 100 is further illustrated in FIG. 5. Please refer to FIGS. 3-5. FIG. 5 is a flowchart illustrating the method 500 of coarse tuning the oscillating frequency Fo of the differential ring oscillator 100 to reach or just cross the boundary (i.e. the lower bound Fth1 or the higher bound Fth2) of the predetermined frequency range FR according to an embodiment of the present invention. Provided that substantially the same result is achieved, the steps of the flowchart shown in FIG. 5 need not be in the exact order shown and need not be contiguous; that is, other steps can be intermediate. The method 500 comprises:

Step 502: Start the coarse tuning mode;
Step 504: Open the switching circuit 304 and connect the controllable tuning signals Vt of the differential ring oscillator 100 to the predetermined reference voltage Vref;
Step 506: Set the fine tuning signal Sf of the differential ring oscillator 100 as the predetermined signal;
Step 508: Set the initial bias current Ib of each delay stage 200 in the differential ring oscillator 100 via the coarse tuning signal Sc;
Step 510: Count the cycle number of the divided output signal Sdiv derived from the output signal So in a predetermined duration;
Step 512: Determine if the oscillating frequency Fo of the output signal So reaches the boundary (i.e. the lower bound Fth1 or the higher bound Fth2) of the predetermined frequency range FR: if no, go to step 514, if yes, go to step 516;
Step 514: Increase the bias current Ib of each delay stage 200 in the differential ring oscillator 100 by one unit of bias current via the coarse tuning signal Sc, go to step 510:
Step 516: Record the coarse tuning signal Sc corresponding to the output signal So having an oscillating frequency substantially equal to or near to the boundary of the predetermined frequency range FR;
Step 518: End the coarse tuning mode.

In Step 506, the processing circuit 308 sets the capacitance of each capacitive array 206 in the differential ring oscillator 100 into a predetermined capacitance via the predetermined signal. In Step 508, the processing circuit 308 sets the initial bias current Ib of each delay stage 200 in the differential ring oscillator 100 via the coarse tuning signal Sc. When the oscillation of the differential ring oscillator 100 is stable, the processing circuit 308 counts the cycle number of the divided output signal Sdiv derived from the output signal So in the predetermined duration. In Step 512, the processing circuit 308 determines if the oscillating frequency Fo of the output signal So reaches the boundary of the predetermined frequency range FR according to the cycle number of the divided output signal Sdiv and the predetermined duration.

If Scheme 1 is applied to calibrate the differential ring oscillator 100, the processing circuit 308 will increase the initial bias current Ib of each delay stage 200 in the differential ring oscillator 100 and detect the oscillating frequency Fo of the output signal So until the oscillating frequency Fo of the output signal So reaches the lower bound Fth1 of the predetermined frequency range FR. If Scheme 2 is applied to calibrate the differential ring oscillator 100, the processing circuit 308 will increase the initial bias current Ib of each delay stage 200 in the differential ring oscillator 100 and detect the oscillating frequency Fo of the output signal So until the oscillating frequency of the output signal So reaches the higher bound Fth2 of the predetermined frequency range FR. In step 516, the processing circuit 308 records the coarse tuning signal Sc corresponding to the output signal So having an oscillating frequency Fo substantially equal to or near to the boundary of the predetermined frequency range FR. Those skilled in the art should understand how to determine the oscillating frequency Fo of the output signal So by using the cycle number of the divided output signal Sdiv and the predetermined duration; a detailed description is therefore omitted here for brevity.

Figure 6:
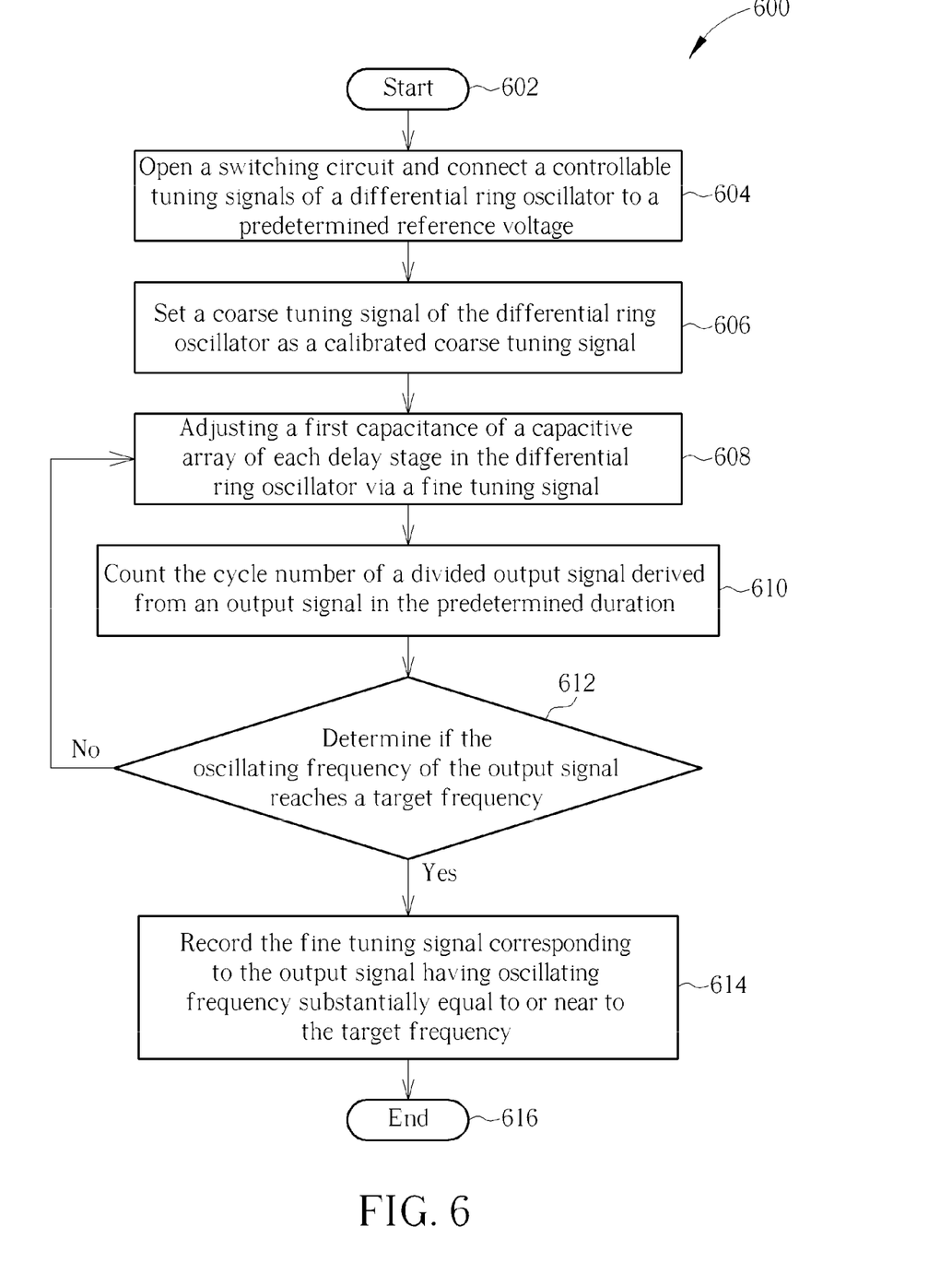
FIG. 6 is a flowchart illustrating a method of fine tuning an oscillating frequency of a differential ring oscillator according to an embodiment of the present invention.

The fine tuning mode for calibrating the differential ring oscillator 100 is illustrated in FIG. 6. Please refer to FIGS. 3-6. FIG. 6 is a flowchart illustrating the method 600 of fine tuning the oscillating frequency Fo of the differential ring oscillator 100 to approach the target frequency Ft in the predetermined frequency range FR according to an embodiment of the present invention. Provided that substantially the same result is achieved, the steps of the flowchart shown in FIG. 6 need not be in the exact order shown and need not be contiguous; that is, other steps can be intermediate. The method 600 comprises:

Step 602: Start the fine tuning mode;

Step 604: Open the switching circuit 304 and connect the controllable tuning signals Vt of the differential ring oscillator 100 to the predetermined reference voltage Vref;

Step 606: Set the coarse tuning signal Sc of the differential ring oscillator 100 as the calibrated coarse tuning signal obtained in step 516;

Step 608: Adjust the first capacitance of the capacitive array 206 of each delay stage 200 in the differential ring oscillator 100 via the fine tuning signal Sf;

Step 610: Count the cycle number of the divided output signal Sdiv derived from the output signal So in the predetermined duration;

Step 612: Determine if the oscillating frequency Fo of the output signal So reaches the target frequency Ft: if no, go to step 608, if yes, go to step 614;

Step 614: Record the fine tuning signal Sf corresponding to the output signal So having an oscillating frequency substantially equal to or near to the target frequency Ft;

Step 616: End the fine tuning mode.

In step 606, the processing circuit 308 sets the coarse tuning signal Sc of the differential ring oscillator 100 as the calibrated coarse tuning signal obtained in step 516. If Scheme 1 is applied to calibrate the differential ring oscillator 100, the processing circuit 308 controls the coarse tuning signal Sc of the differential ring oscillator 100 to make the initial oscillating frequency Fo of the fine tuning mode start at the lower bound Fth1 of the predetermined frequency range FR. If Scheme 2 is applied to calibrate the differential ring oscillator 100, the processing circuit 308 controls the coarse tuning signal Sc of the differential ring oscillator 100 to make the initial oscillating frequency Fo of the fine tuning mode start at the higher bound Fth2 of the predetermined frequency range FR.

In step 608, the processing circuit 308 adjusts the first capacitance of the capacitive array 206 of each delay stage 200 in the differential ring oscillator 100 via the fine tuning signal Sf in order to change the sub-band of the output signal So. Please refer to FIG. 4 again. If Scheme 1 is applied to calibrate the differential ring oscillator 100, the processing circuit 308 reduces the first capacitance of the capacitive array 206 of each delay stage 200 in the differential ring oscillator 100 to increase the sub-band (i.e. from SubX5 to SubX3) of the output signal So. If Scheme 2 is applied to calibrate the differential ring oscillator 100, the processing circuit 308 increases the first capacitance of the capacitive array 206 of each delay stage 200 in the differential ring oscillator 100 to decrease the sub-band (i.e. from SubX0 to SubX2) of the output signal So. It should be noted that the processing circuit 308 may use a binary search method to change the sub-band of the output signal So.

Each time the processing circuit 308 changes the sub-band of the output signal So, the processing circuit 308 counts the cycle number of the divided output signal Sdiv derived from the output signal So in the predetermined duration to determine if the oscillating frequency Fo of the output signal So reaches the target frequency Ft (i.e. Step 610 and Step 612). The processing circuit 308 may repeat the Steps 608-612 until the oscillating frequency Fo of the output signal So reaches or approaches the target frequency Ft. In step 614, the processing circuit 308 records the fine tuning signal Sf corresponding to the output signal So having an oscillating frequency Fo substantially equal to or near to the target frequency Ft.

By using the methods as taught in FIG. 5 and FIG. 6, the differential ring oscillator 100 is calibrated to generate the output signal So having an oscillating frequency Fo substantially equal to or near to the target frequency Ft. More specifically, the present method first adjusts the bias current Ib of each delay stage 200 in the differential ring oscillator 100 to coarse tune the oscillating frequency of the output signal So to reach the predetermined frequency range FR, and then adjusts the first capacitance of the capacitive array 206 of each delay stage 200 in the differential ring oscillator 100 to fine tune the oscillating frequency Fo of the output signal So to reach or approach the target frequency Ft. Then, during the frequency locking mode, the detecting circuit 302 is enabled, the predetermined reference voltage Vref is disconnected from the controllable tuning signals Vt of each delay stage 200 in the differential ring oscillator 100, and the switching circuit 304 is closed (i.e. turned on) to output the detecting signal Sdet as the controllable tuning signals Vt. During the frequency locking mode, the phase-locked loop, which comprises the detecting circuit 302, the differential ring oscillator 100, and the dividing circuit 306, is changed from an open-loop to a closed-loop to lock the reference clock signal Sref for generating the output signal So having an oscillating frequency Fo substantially equal to the target frequency Ft.

Please refer to FIG. 4 again. The calibrated bias current Ib obtained in Scheme 1 is smaller than the calibrated bias current Ib obtained in Scheme 2 since the oscillating frequency of the lower bound Fth1 is lower than the oscillating frequency of the higher bound Fth2. In other words, the operating current of the differential ring oscillator 100 obtained in Scheme 1, which comprises the bias current Ib of each delay stage 200 in the differential ring oscillator 100, is smaller than the operating current of the differential ring oscillator 100 obtained in Scheme 2.

By using the current source 202 instead of voltage source to supply power to the differential ring oscillator 100, the frequency pushing effect of the differential ring oscillator 100 is greatly reduced. By using the varactor (i.e. the capacitors C1 and C2) to adjust the second capacitance of the differential ring oscillator 100, the differential ring oscillator 100 can achieve better phase noise with much smaller KVCO (i.e. gain of the voltage-controlled oscillator). Moreover, by using the present methods as taught in FIGS. 1-6 to calibrate the oscillating frequency Fo of the differential ring oscillator 100, the present methods can cover all process variations (the so called tt, ff, ss, fs, sf corners) affecting the differential ring oscillator 100. Another advantage of the differential ring oscillator 100 being calibrated by the proposed method is the small circuit performance variation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A differential ring oscillator, comprising:
   a plurality of delay stages, connected in a ring, wherein at least one of the delay stages comprises:
      a current source, arranged to generate a bias current according to a coarse tuning signal;

a latching circuit, coupled to the current source and arranged to generate a differential output signal to a next delay stage according to a differential input signal from a previous delay stage;

a capacitive array, coupled to the latching circuit and arranged to provide a first capacitance according to a fine tuning signal; and a varactor device, coupled to the capacitive array and arranged to provide a second capacitance according to a controllable signal such that an oscillating frequency of the differential ring oscillator is locked to a target frequency;

wherein the coarse tuning signal is arranged for adjusting the oscillating frequency of the differential ring oscillator to reach a predetermined frequency range including the target frequency, and the fine tuning signal is arranged for adjusting the oscillating frequency of the differential ring oscillator to approach the target frequency in the predetermined frequency range.

2. The differential ring oscillator of claim 1, wherein when the current source adjusts the oscillating frequency of the differential ring oscillator by the coarse tuning signal to reach the predetermined frequency range, the fine tuning signal is coupled to a predetermined voltage level.

3. The differential ring oscillator of claim 1, wherein when the capacitive array is adjusting the oscillating frequency of the differential ring oscillator by the fine tuning signal to approach the target frequency in the predetermined frequency range, the controllable signal is coupled to a predetermined voltage level.

4. The differential ring oscillator of claim 1, wherein the current source comprises:

a diode-connected transistor, coupled to a reference voltage and a reference current; and a plurality of transistors, each transistor having a gate terminal, a source terminal, and a drain terminal;

wherein the plurality of gate terminals of the plurality of transistors are coupled to a gate terminal of the diode-connected transistor, the plurality of source terminals of the plurality of transistors are coupled to the reference voltage, the plurality of drain terminals of the plurality of transistors are coupled to the latching circuit, and the plurality of transistors are arranged to mirror the reference current for generating the bias current according to the coarse tuning signal.

5. The differential ring oscillator of claim 4, wherein the reference voltage is generated by a low drop-out regulator.

6. The differential ring oscillator of claim 4, wherein the coarse tuning signal is arranged to control the plurality of transistors to change the bias current for adjusting the oscillating frequency of the differential ring oscillator to reach the predetermined frequency range.

7. The differential ring oscillator of claim 1, wherein the latching circuit comprises:

a differential input stage, coupled to the current source, and having a first input terminal and a second input terminal arranged to receive a first input signal and a second input signal of the differential input signal to generate a first output signal and a second output signal of the differential output signal at a first output terminal and a second output terminal respectively;

a first latching cell, coupled to the current source and the first output terminal and the second output terminal, and arranged to latch the first output signal and the second output signal; and a resistive device, coupled to the first output terminal, the second output terminal, and a reference voltage.

8. The differential ring oscillator of claim 7, wherein the latching circuit further comprises:

a second latching cell, coupled to the first output terminal, the second output terminal, and the reference voltage, and arranged to latch the first output signal and the second output signal.

9. The differential ring oscillator of claim 8, wherein the current source is a P-type transistor current source, the differential input stage is a P-type transistor pair, the first latching cell is a P-type transistor latching cell, and the second latching cell is an N-type transistor latching cell.

10. The differential ring oscillator of claim 7, wherein the capacitive array comprises:

a plurality of capacitors, coupled to the first output terminal and the second output terminal, and arranged to provide the first capacitance according to the fine tuning signal.

11. The differential ring oscillator of claim 10, wherein when the oscillating frequency of the differential ring oscillator is higher than the target frequency, the fine tuning signal is arranged to increase the first capacitance provided by the plurality of capacitors.

12. The differential ring oscillator of claim 10, wherein when the oscillating frequency of the differential ring oscillator is lower than the target frequency, the fine tuning signal is arranged to decrease the first capacitance provided by the plurality of capacitors.

13. A method for calibrating a differential ring oscillator, wherein the differential ring oscillator comprises a plurality of delay stages, at least one of the delay stages comprises a current source, a latching circuit, a capacitive array, and a varactor device, and the method comprises:

generating a bias current according to a coarse tuning signal;

generating a differential output signal to a next delay stage according to a differential input signal from a previous delay stage;

providing a first capacitance according to a fine tuning signal; and providing a second capacitance according to a controllable signal such that an oscillating frequency of the differential ring oscillator is locked to a target frequency;

wherein the coarse tuning signal is arranged for adjusting the oscillating frequency of the differential ring oscillator to reach a predetermined frequency range including the target frequency, and the fine tuning signal is arranged for adjusting the oscillating frequency of the differential ring oscillator to approach the target frequency in the predetermined frequency range.

14. The method of claim 13, wherein when the oscillating frequency of the differential ring oscillator is adjusted by the coarse tuning signal to reach the predetermined frequency range, the method further comprises:

coupling the fine tuning signal to a predetermined voltage level.

15. The method of claim 13, wherein when the oscillating frequency of the differential ring oscillator is adjusted by the fine tuning signal to approach the target frequency in the predetermined frequency range, the method further comprises:

coupling the controllable signal to a predetermined voltage level.

16. The method of claim 13, wherein the step of providing the first capacitance according to the fine tuning signal comprises:

when the oscillating frequency of the differential ring oscillator is higher than the target frequency, controlling the fine tuning signal to increase the first capacitance.

17. The method of claim 13, wherein the step of providing the first capacitance according to the fine tuning signal comprises:

when the oscillating frequency of the differential ring oscillator is lower than the target frequency, controlling the fine tuning signal to decrease the first capacitance.

\* \* \* \* \*